(12) United States Patent
Hao et al.

(10) Patent No.: US 11,548,273 B2
(45) Date of Patent: Jan. 10, 2023

(54) APPARATUS AND METHOD FOR REMOVING A FILM FROM A SURFACE

(71) Applicant: ASMPT SINGAPORE PTE. LTD., Singapore (SG)

(72) Inventors: Ji Yuan Hao, Singapore (SG); Patrocinio Jr Go Torres, Singapore (SG); Teng Hock Kuah, Singapore (SG); Kai Wu, Singapore (SG); Moung Kai Kong, Singapore (SG)

(73) Assignee: ASMPT SINGAPORE PTE. LTD., Singapore (SG)

( * ) Notice: Subject to any disclaimer, the term of this patent is extended or adjusted under 35 U.S.C. 154(b) by 357 days.

(21) Appl. No.: 16/778,429

(22) Filed: Jan. 31, 2020

(65) Prior Publication Data
US 2021/0237422 A1    Aug. 5, 2021

(51) Int. Cl.
| | |
|---|---|
| *B32B 43/00* | (2006.01) |
| *H01L 21/56* | (2006.01) |
| *H01L 21/687* | (2006.01) |
| *H01L 21/67* | (2006.01) |

(52) U.S. Cl.
CPC .......... *B32B 43/006* (2013.01); *H01L 21/566* (2013.01); *H01L 21/67253* (2013.01); *H01L 21/68707* (2013.01); *B32B 2457/00* (2013.01); *Y10T 156/1168* (2015.01); *Y10T 156/1189* (2015.01); *Y10T 156/1195* (2015.01); *Y10T 156/1978* (2015.01); *Y10T 156/1994* (2015.01)

(58) Field of Classification Search
CPC ............. B32B 43/006; Y10T 156/1168; Y10T 156/1189; Y10T 156/1196; Y10T 156/1978; Y10T 156/1994
See application file for complete search history.

(56) References Cited

U.S. PATENT DOCUMENTS

| | | | | |
|---|---|---|---|---|
| 5,676,789 A | * | 10/1997 | Hamamura | ......... B29C 63/0013 156/714 |
| 6,227,276 B1 | * | 5/2001 | Kim | .................... B29C 63/0013 156/247 |
| 6,503,130 B2 | * | 1/2003 | Lim | ........................ B24B 37/34 156/716 |

(Continued)

FOREIGN PATENT DOCUMENTS

KR    10-2009-0081499 A    7/2009

*Primary Examiner* — Philip C Tucker
*Assistant Examiner* — Nickolas R Harm
(74) *Attorney, Agent, or Firm* — Ostrolenk Faber LLP

(57) ABSTRACT

After molding a substrate located between first and second molds of a molding system, a used release film that is in contact with the substrate during molding is removed from the molding system with a gripper assembly, which is reciprocally movable between a retracted position outside the molding system and an extended position in a space between the first and second molds when the first and second molds are opened. A carriage mechanism on which the gripper assembly is mounted moves the gripper assembly towards the first or second mold until the gripper assembly contacts the used release film, before an actuator actuates the gripper assembly to clamp onto a part of the used release film. The carriage mechanism also conveys the gripper assembly away from the first mold or second mold to remove the used release film from the molding system.

13 Claims, 8 Drawing Sheets

(56) References Cited

U.S. PATENT DOCUMENTS

| | | | |
|---|---|---|---|
| 7,784,515 B2* | 8/2010 | Nonaka | H01L 21/67132 156/380.7 |
| 2003/0168145 A1* | 9/2003 | Suga | H01L 21/67092 156/60 |
| 2015/0261206 A1* | 9/2015 | Shiino | G05B 19/409 700/257 |
| 2020/0148491 A1* | 5/2020 | Lin | B25J 15/0071 |

* cited by examiner

APPARATUS AND METHOD FOR REMOVING A FILM FROM A SURFACE

FIELD OF THE INVENTION

The present invention relates to an apparatus and method for removing a film from a surface, particularly from a molded compound or molding tool surface, after a molding process for a semiconductor device.

BACKGROUND

Semiconductor devices are encapsulated with a molding material to protect the semiconductor chips therein from the external environment. The encapsulation process may comprise mounting a semiconductor chip onto a supporting surface or substrate, such as a wafer or a lead frame, and then introducing a molding material such as an epoxy resin around the semiconductor chip to form molded semiconductor devices.

Film-assisted molding (FAM) is a popular semiconductor device encapsulation process that uses a release film to enhance the encapsulation process. FIG. 1 is a schematic view of a conventional molding apparatus 100 for performing FAM. The molding apparatus 100 comprises a top mold 102 and a bottom mold 104 clamping onto a substrate 106 in a closed configuration, thus forming a molding cavity 120 which is to be filled with a molding material during molding. Semiconductor chips 108 are mounted on the upper surface of the substrate 106, and a release film 110 covers an inner surface of the top mold 102 in the molding cavity 120. The molding material is subsequently introduced into the molding cavity 120 to surround the semiconductor chips 108. Thereafter, the molding material is cured so that it hardens, thus forming a molded semiconductor device.

One of the benefits of FAM is that by covering the inner surface of the top mold 102 in the molding cavity 120 with the release film 110, the molding material does not come into direct contact with the inner surface of the top mold 102 in the molding cavity 120. Thus, the surfaces of the top mold 102 would not be contaminated by the molding material, so that the need to clean or condition the inner surface of the top mold 102 prior to subsequent molding steps is avoided. Furthermore, the release film 110 comprises a resilient material, which is useful for cushioning the various components in the molding apparatus 100 during the encapsulation process and for sealing the molding cavity 120 more tightly in order to improve a vacuum generation capability of the molding apparatus 100.

After the encapsulation process, the top mold 102 separates from the bottom mold 104 to an open configuration, at which point the release film 110 may either adhere to a molded compound surface of the molded substrate 106, as shown in FIG. 2A, or adhere to the lower surface of the top mold 102, as shown in FIG. 2B. One conventional approach to removing the release film 110 from the molded compound surface of the molded substrate 106 or the lower surface of the top mold 102 would involve blowing a stream of air between the release film 110 and the surface to which it adheres in order to detach the release film 110 from the surface. However, this conventional approach is ineffective when the molding material is very sticky or if the molding apparatus 100 is relatively small. Hence, it would be desirable to provide a more effective method of removing the release film 110 from the surface to which it adheres.

SUMMARY OF THE INVENTION

It is thus an object of the invention to seek to provide an apparatus and a method for removing a release film from a surface, such as a molded compound surface or a surface of a molding tool, after a semiconductor device molding process.

Accordingly, the invention provides an apparatus for removing a used release film from a molding system comprising first and second molds after molding a substrate located between the first and second molds, the substrate being in contact with the used release film during molding, the apparatus comprising: a gripper assembly which is reciprocally movable between a retracted position outside the molding system and an extended position in a space between the first and second molds when the first and second molds are opened and the molding system is arranged in an open configuration; a carriage mechanism on which the gripper assembly is mounted, the carriage mechanism being operative to move the gripper assembly towards the first or second mold until the gripper assembly contacts the used release film; and an actuator to actuate the gripper assembly to clamp onto a part of the used release film; wherein the carriage mechanism is further operative to convey the gripper assembly away from the first mold or second mold while the gripper assembly is clamping the used release film, whereby to remove the used release film from the molding system.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION OF THE PREFERRED EMBODIMENT OF THE INVENTION

Figure 1:
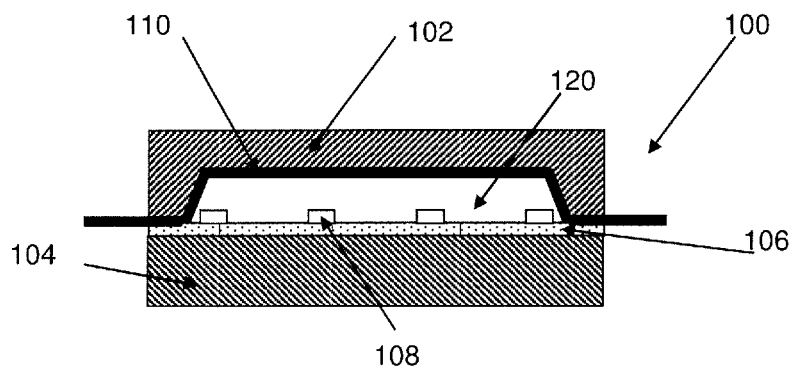
FIG. 1 is a schematic front view of a conventional molding apparatus for performing film-assisted molding (FAM)
Figure 2A:
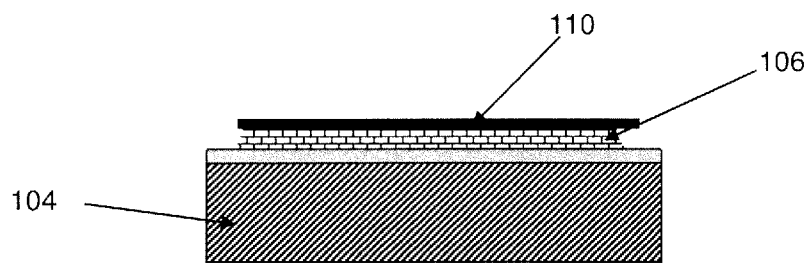
FIGS. 2A and 2B respectively show a release film adhering to a molded compound surface of a molded substrate and the release film adhering to a lower surface of a top mold.
Figure 2B:
Figure 3:
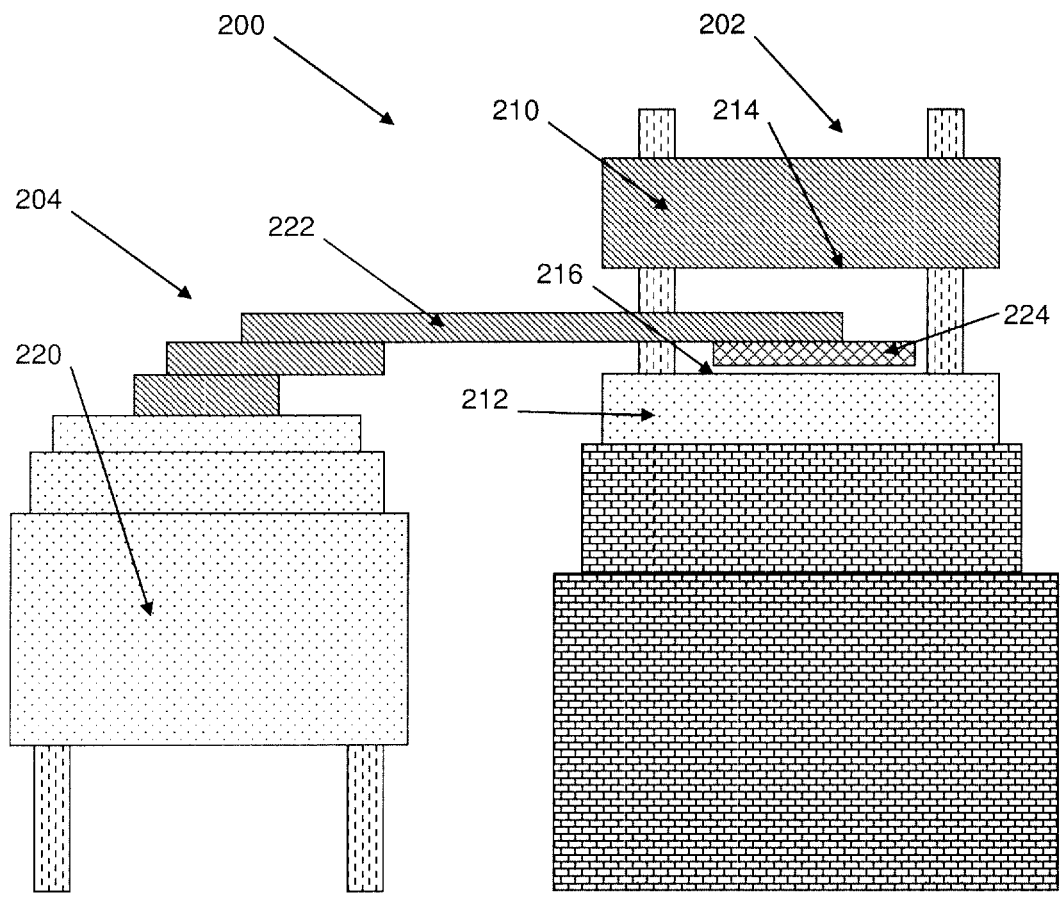
FIG. 3 is a schematic front view of an FAM apparatus according to the preferred embodiment of the invention.

FIG. 3 is a schematic front view of a molding system in the form of a film-assisted molding (FAM) apparatus 200 according to the preferred embodiment of the invention. The FAM apparatus 200 comprises a molding assembly 202 and a carriage or robot assembly 204.

The molding assembly 202 or molding tool comprises a first mold, such as a top mold 210, and a second mold, such as a bottom mold 212, that are movable relative to each other. The top mold 210 and the bottom mold 212 may be moved to a closed configuration wherein a molding cavity is formed between the top mold 210 and the bottom mold 212. A top mold surface 214 of the top mold 210 is oppositely facing a bottom mold surface 216 of the bottom mold 212. The top mold surface 214 and the bottom mold surface 216 are operative to clamp onto a substrate and to apply a clamping pressure thereto in the closed configuration, when molding the substrate.

The substrate, which includes semiconductor chips mounted thereon to be encapsulated by the FAM apparatus 200, may be positioned and clamped between the top mold 210 and the bottom mold 212. The semiconductor chips on the substrate are generally located within the molding cavity in the closed configuration. The substrate may be held onto the top mold 210 and a length of film may be provided to cover a bottom mold surface 216 oppositely facing the substrate. Alternatively, the substrate may be held onto the bottom mold 212 and the length of film may be provided to cover a top mold surface 214 oppositely facing the substrate. A molding compound may be introduced into the molding cavity to surround the semiconductor chips in the closed configuration of the molding assembly 202.

The top mold 210 and the bottom mold 212 are movable away from each other from the closed configuration to an open configuration, wherein the top mold 210 is separated from the bottom mold 212, as shown in FIG. 3. After completing an encapsulation or molding process cycle, the top mold 210 and the bottom mold 212 may be moved from the closed configuration to the open configuration. At that time, a length of used release film should be detached from the surface to which it is adhering and the molded substrate may then be removed from between the top mold 210 and the bottom mold 212. A new unmolded substrate and a fresh length of film may then be positioned at predetermined positions on the top mold surface 214 and the bottom mold surface 216 in preparation for a subsequent encapsulation process cycle.

The carriage or robot assembly 204 comprises a carriage or robot motor 220 for driving a carriage mechanism, which may be a robotic arm 222 or other kind of conveyance system, and a gripper assembly 224 attached and mounted to a remote end of the robotic arm 222. In an open configuration of the molding system, the robot motor 220 may drive the robotic arm 222 from a retracted position away from the molding assembly 202 to an extended position wherein the gripper assembly 224 is positioned between the top mold 210 and the bottom mold 212, as shown in FIG. 3. The robot motor 220 may also reciprocally drive the robotic arm 222 to the retracted position, so that the robotic arm 222 and the gripper assembly 224 are no longer between the top mold 210 and the bottom mold 212, and the top mold 210 and the bottom mold 212 are free to move to the closed configuration of the molding system. The gripper assembly 224 is operable to grip the length of film which has been used during a molding cycle, and peel it from the surface to which it has adhered.

Figure 4A:
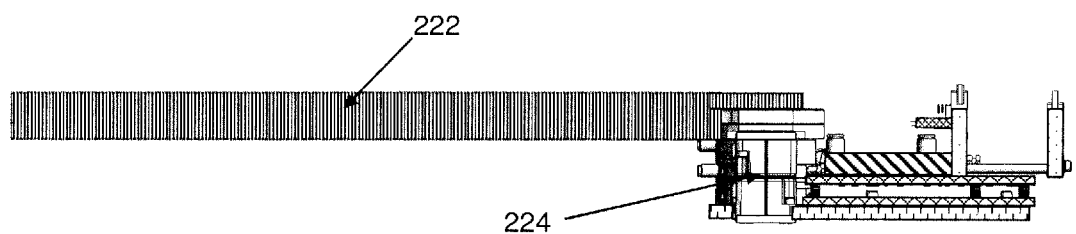
FIGS. 4A and 4B respectively show a gripper assembly which is oriented upwards towards a top mold and a gripper assembly which is oriented downwards towards a bottom mold.
Figure 4B:
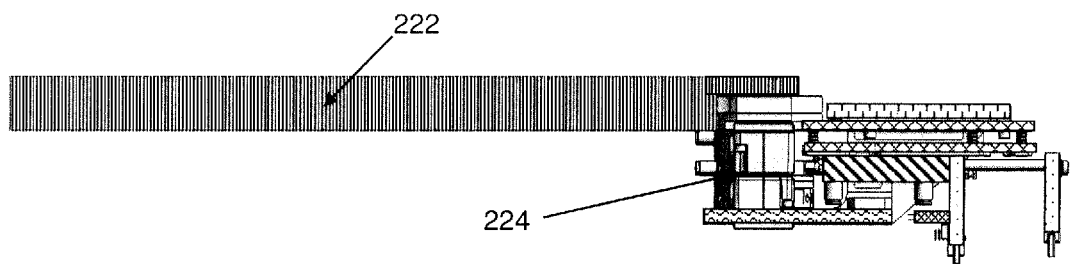

FIGS. 4A and 4B respectively show the gripper assembly 224 which is oriented upwards towards the top mold 210 and the gripper assembly 224 which is oriented downwards towards the bottom mold 212. The gripper assembly 224 may be oriented upwards towards the top mold 210 when the used release film is adhered to the top mold 210 or the gripper assembly 224 may be oriented downwards towards the bottom mold 212 instead when the used release film is adhered to the bottom mold 212.

Figure 5A:
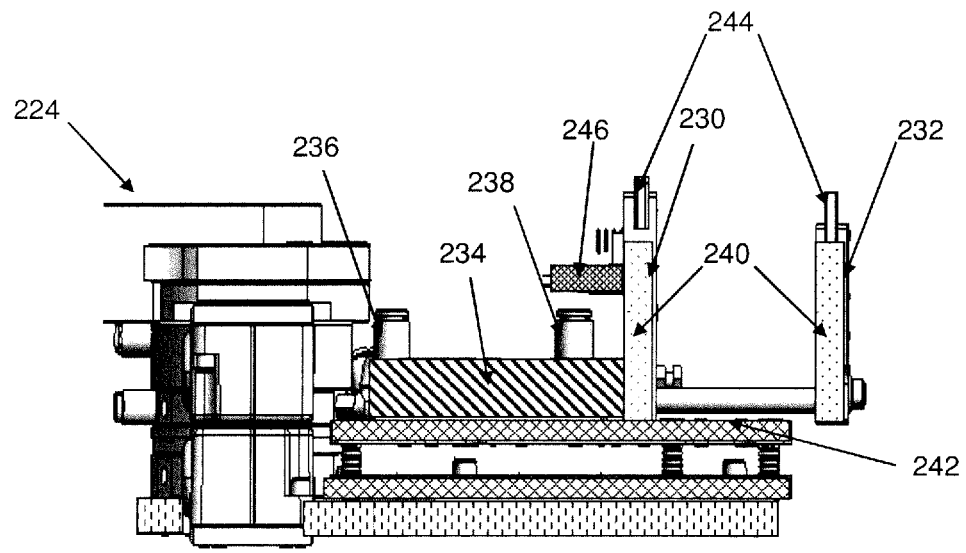
FIGS. 5A and 5B respectively show the upwards oriented gripper assembly and the downwards oriented gripper assembly.
Figure 5B:
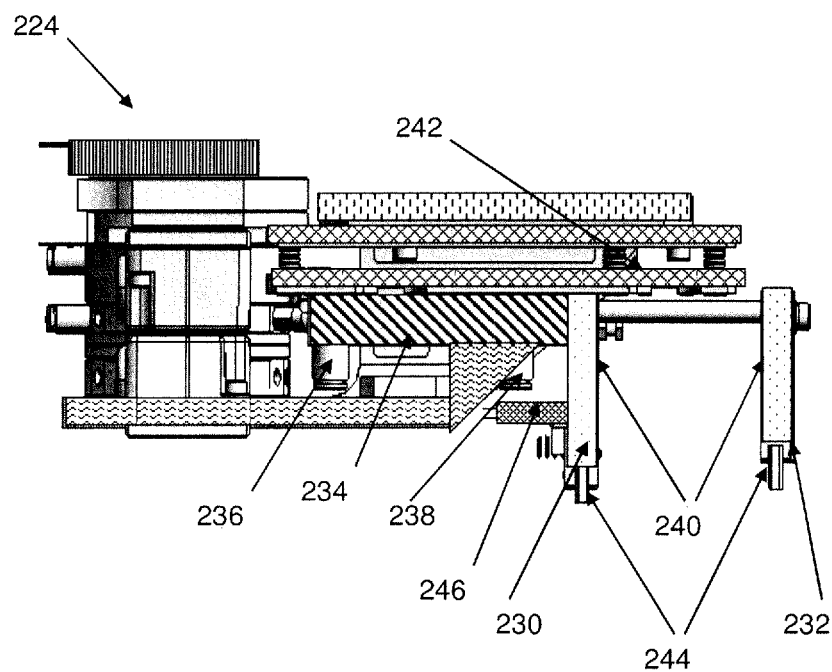

FIGS. 5A and 5B respectively show the upwards oriented gripper assembly 224 and the downwards oriented gripper assembly 224. The gripper assembly 224 comprises an elongated body 242, and a first gripper finger 230 and a second gripper finger 232 extending perpendicularly from the elongated body 242. The first gripper finger 230 and the second gripper finger 232 each comprises a cantilever body 240 having a linked end attached to the elongated body 242 of the gripper assembly 224, as well as a free end. The first gripper finger 230 and the second gripper finger 232 further comprise resilient tips 244 located at the free ends of their cantilever bodies 240. The resilient tips 244 of the first gripper finger 230 and the second gripper finger 232 may point towards either the top mold 210 if the gripper assembly 224 is oriented upwards towards the top mold 210 (as shown in FIGS. 4A and 5A), or the bottom mold 212 if the gripper assembly 224 is oriented downwards towards the bottom mold 212 (as shown in FIGS. 4B and 5B). In particular, in one preferred embodiment, the resilient tips 244 are interchangeably configured to point towards the top mold 210 or the bottom mold 212.

These resilient tips 244 may have high-friction surface textures which are effective for engaging and gripping the film when they make contact with the film. The cantilever body 240 of the first gripper finger 230 is arranged parallel to the cantilever body 240 of the second gripper finger 232, and they are kept generally parallel to each other when they move relative to each other. However, other configurations are possible, for example, the cantilever bodies 240 of the first gripper finger 230 and the second gripper finger 232 may converge towards each other at their free ends.

In one configuration, the first gripper finger 230 or the second gripper finger 232 is fixed and the other finger is movable, and in an alternative configuration, both the first gripper finger 230 and the second gripper finger 232 are movable relative to each other. The first gripper finger 230 and the second gripper finger 232 are actuated by an actuator 234, such as a pneumatic actuator, comprising an air inlet 236 and an air outlet 238. The actuator 234 may draw in air from the air inlet 236 in order to move the first gripper finger 230 and the second gripper finger 232 away from each other to an open position, and expel air through the air outlet 238 in order to move the first gripper finger 230 and the second gripper finger 232 together to a gripping position. The gripper assembly 224 further comprises a sensor 246, such as a proximity sensor (which may be located on one or both gripper fingers 230, 232), for detecting whether the first gripper finger 230 and the second gripper finger 232 are in in contact with the used release film 208 before the actuator 234 actuates the gripper fingers 230, 232 to grip or clamp the used release film 208. The sensor 246 may also detect whether the first gripper finger 230 and the second gripper finger 232 have successfully gripped or clamped onto the film.

An advantage of using the gripper assembly 224 to detach the used release film 208 from the surface to which it is adhering is that mechanical gripping by the gripper assembly 224 is more effective than the conventional methods, as the gripper assembly 224 can grip the used release film 208 more firmly.

Figure 6A:
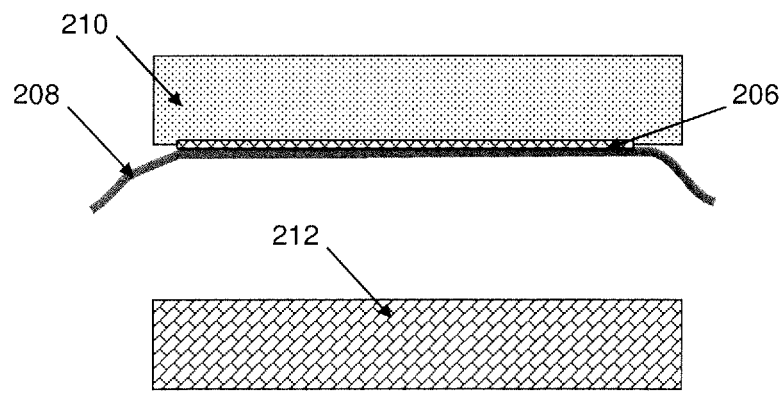
FIGS. 6A-6F illustrate a method of removing a length of film with the upwards oriented gripper assembly.

FIGS. 6A-6F illustrate a method of removing a length of used release film 208 with the upwards oriented gripper assembly 224. FIG. 6A shows the top mold 210 and the bottom mold 212 in the open configuration wherein they are separated from each other. A molded substrate 206 is held onto the top mold 210 against the top mold surface 214, for instance, by vacuum suction. The length of used release film 208 is adhering to a molded compound surface of the molded substrate 206. Although FIGS. 6A-6F show the used release film 208 adhering to the molded compound surface of the molded substrate 206, such a method of removing the used release film 208 with the upwards oriented gripper assembly 224 may also be performed if the used release film 208 is adhering to the top mold surface 214.

Figure 6B:
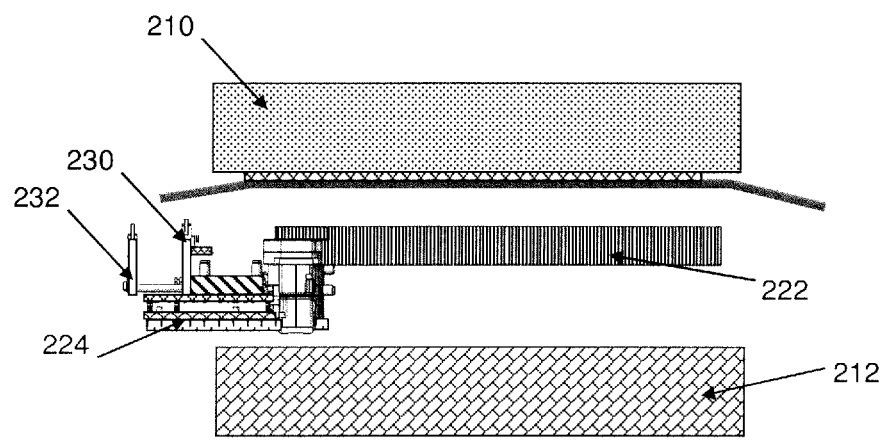

The robot motor 220 drives the robotic arm 222 to an extended position such that the upwards oriented gripper assembly 224 is disposed between the top mold 210 and the bottom mold 212, as shown in FIG. 6B. The first gripper finger 230 and the second gripper finger 232 are positioned apart in the open position.

Figure 6C:
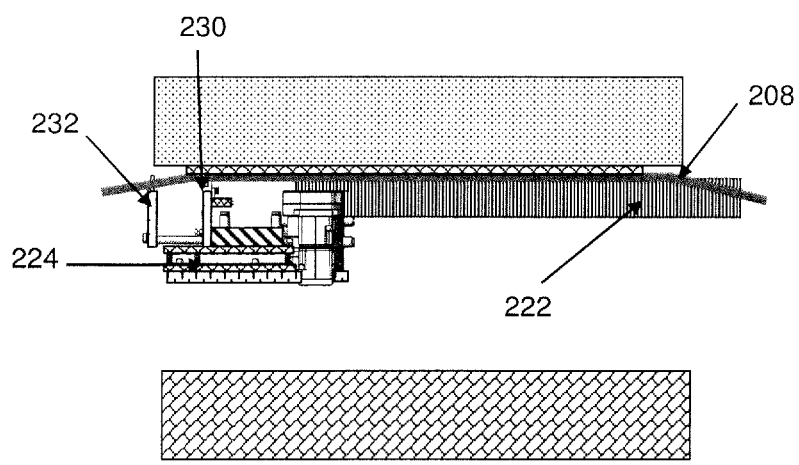

The robotic arm 222 moves the gripper assembly 224 upwards towards the top mold 210 until the gripper assembly 224 makes contact with the length of used release film 208, as shown in FIG. 6C. Whilst the first gripper finger 230 and the second gripper finger 232 are still positioned apart in the open position, the resilient tips 244 are now in contact with the used release film 208.

Figure 6D:
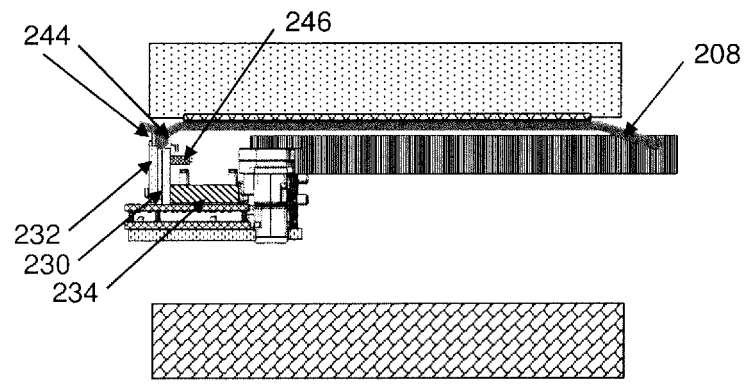

The actuator 234 moves the first gripper finger 230 and the second gripper finger 232 towards each other while the resilient tips 244 are in contact with the used release film 208. While the first gripper finger 230 and the second gripper finger 232 are moving towards each other, the resilient tips 244 of the first gripper finger 230 and the second gripper finger 232 start to clamp onto the used release film 208. When the gripper assembly 224 has moved to the closed position, the first gripper finger 230 and the second gripper finger 232 would have gripped or clamped onto a part of the used release film 208, as shown in FIG. 6D. The sensor 246 detects whether the gripper assembly 224 has successfully gripped the used release film 208. If the sensor 246 detects that the gripper assembly 224 has failed to grip onto the used release film 208, the gripper assembly 224 may repeatedly try to grip the used release film 208 a predetermined number of times before raising an alarm to alert an operator if it is finally still unsuccessful in gripping the release film 208.

Figure 6E:
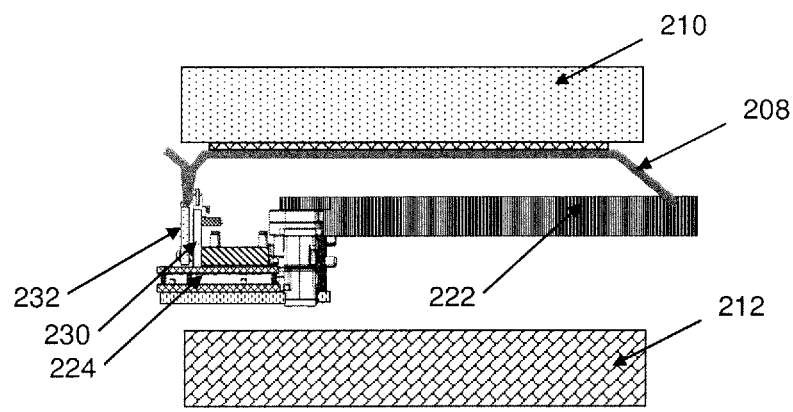
Figure 6F:
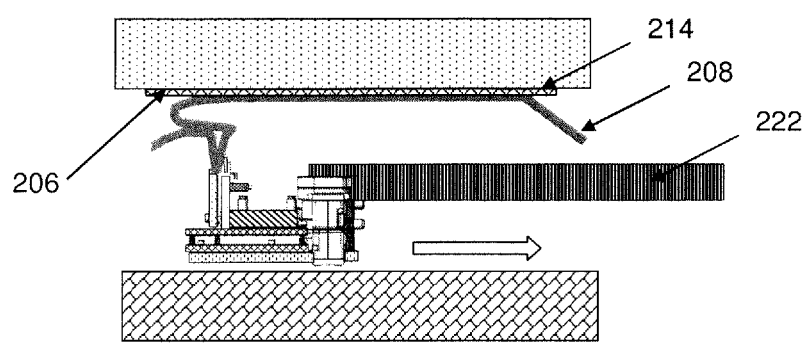

After the gripper assembly 224 has successfully gripped the used release film 208, the robotic arm 222 moves downwards away from the top mold 210 to a more central position between the top mold 210 and the bottom mold 212, as shown in FIG. 6E. The first gripper finger 230 and the second gripper finger 232 remain in the closed position, gripping onto the used release film 208, as the gripper assembly 224 moves to the more central position. Subsequently, the robot motor 220 drives the robotic arm 222 towards the retracted position, thus peeling and detaching the length of used release film 208 from the surface to which it is adhering, whether it is the molded compound surface of the molded substrate 206 or the top mold surface 214. Hence, the used release film 208 is removed from the molding system by the gripper assembly 224.

Figure 7A:
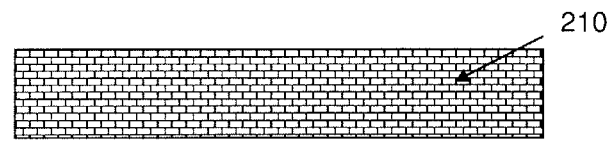
FIGS. 7A-7F illustrate another method of removing the length of film with the downwards oriented gripper assembly.
Figure 7A:
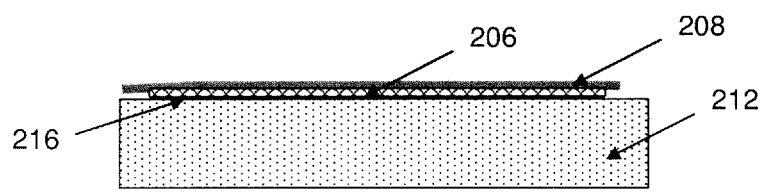

FIGS. 7A-7F illustrate a method of removing the length of film 208 with the downwards oriented gripper assembly 224. This method is similar to the method illustrated in FIGS. 6A-6F except that the gripper assembly 224 in this method is oriented downwards and the used release film 208 is adhered on a molded substrate 206 on the bottom mold 212. FIG. 7A shows the top mold 210 and the bottom mold 212 in the open configuration. The molded substrate 206 is held onto the bottom mold 212 against the bottom mold surface 216. The used release film 208 is adhering to a surface of the molded substrate 206. Although FIGS. 7A-7F show the used release film 208 adhering to the surface of the molded substrate 206, this method of removing the used release film 208 with the downwards oriented gripper assembly 224 may also be performed if the used release film 208 is adhering to the bottom mold surface 216.

Figure 7B:
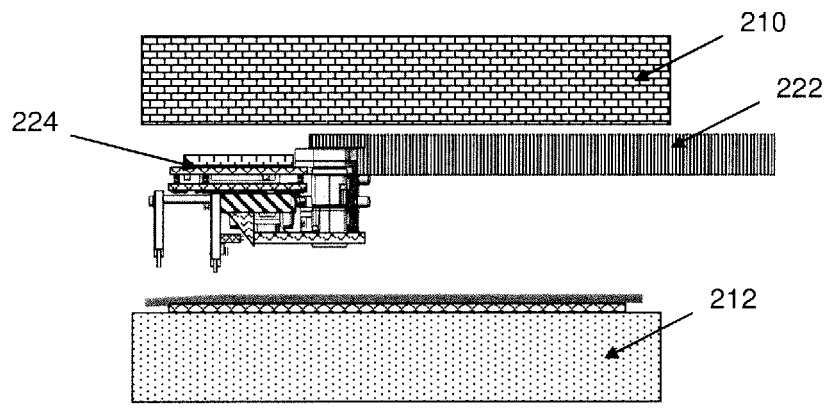
Figure 7C:
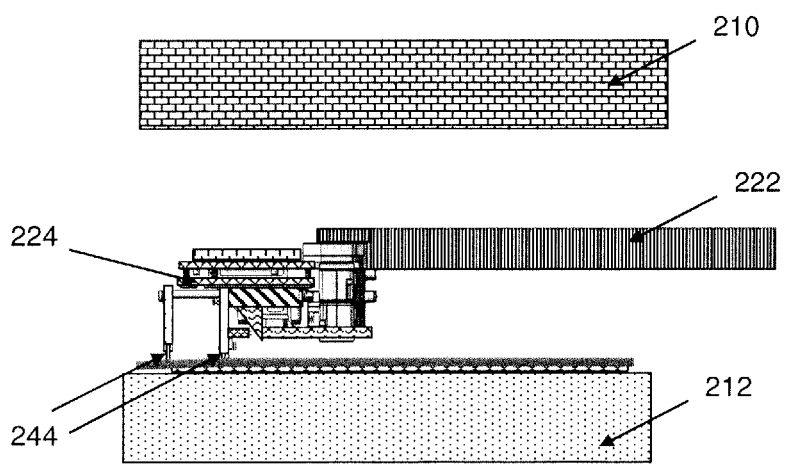

The robotic arm 222 moves to an extended position such that the downwards oriented gripper assembly 224 is disposed between the top mold 210 and the bottom mold 212, as shown in FIG. 7B. Then the robotic arm 222 moves vertically downwards until the resilient tips 244 of the gripper assembly 224 are in contact with the used release film 208, as shown in FIG. 7C.

Figure 7D:
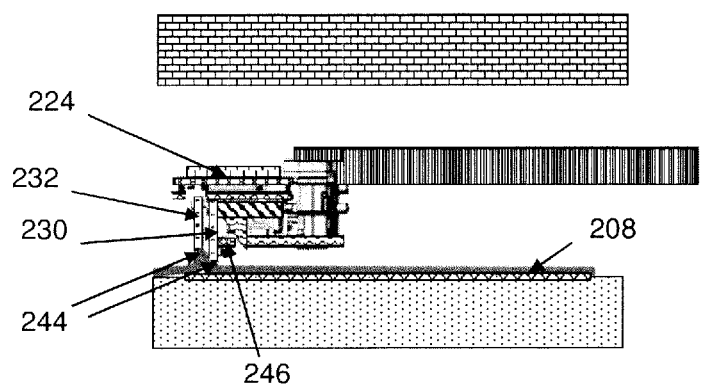

The first gripper finger 230 and the second gripper finger 232 move towards each other while the resilient tips 244 are in contact with the used release film 208. When the gripper assembly 224 has moved to the closed position, the first gripper finger 230 and the second gripper finger 232 would have gripped or clamped onto a part of the used release film 208, as shown in FIG. 7D. The sensor 246 detects whether the gripper assembly 224 has successfully gripped onto the used release film 208.

Figure 7E:
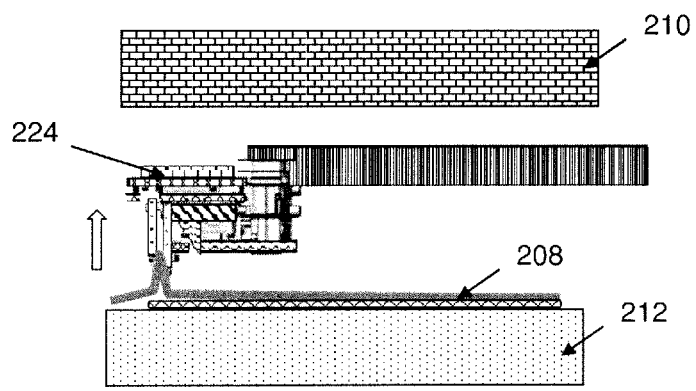
Figure 7F:
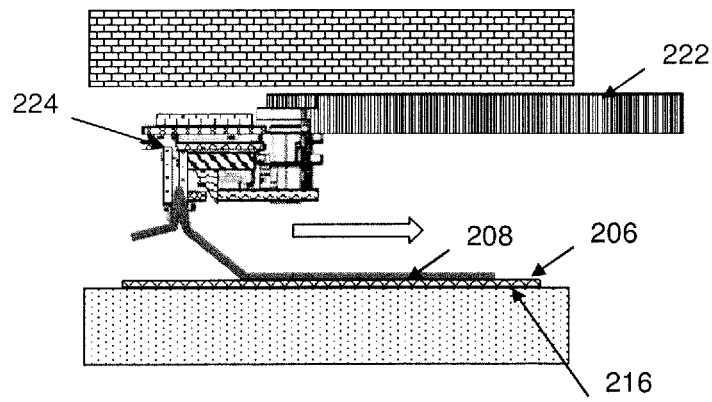

After the gripper assembly 224 has successfully gripped onto the used release film 208, the robotic arm 222 moves vertically upwards away from the bottom mold 212 to a more central position between the top mold 210 and the bottom mold 212, as shown in FIG. 7E. Subsequently, the gripper assembly 224 moves towards the retracted position, thus peeling and detaching the length of used release film 208 from the surface to which it is adhering, such as the molded compound surface of the molded substrate 206 or the bottom mold surface 216.

Although the present invention has been described in considerable detail with reference to certain embodiments, other embodiments are possible.

For example, the first gripper finger 230 and the second gripper finger 232 may move relative to each other by turning about a common pivot or rotational axis, which motion is similar to the movement of two arms of a pair of tongs. Furthermore, a rotary mechanism (not shown) may be incorporated at an interface between the gripper assembly 224 and the robotic arm 222 so that the orientation of the gripper assembly 224 is not fixed, but is rotatable between an upwards orientation and a downwards orientation Therefore, the spirit and scope of the appended claims should not be limited to the description of the embodiments contained herein.

The invention claimed is:

1. Apparatus for removing a used release film from a molding system comprising first and second molds after molding a substrate located between the first and second molds, the substrate being in contact with the used release film during molding, the apparatus comprising:
   a gripper assembly which is reciprocally movable between a retracted position outside the molding system and an extended position in a space between the first and second molds when the first and second molds are opened and the molding system is arranged in an open configuration;
   a carriage mechanism on which the gripper assembly is mounted, the carriage mechanism being operative to move the gripper assembly to the extended position and towards the first or second mold until the gripper assembly contacts the used release film adhered to the first or second mold or the substrate; and
   an actuator to actuate the gripper assembly to clamp onto a part of the used release film;
   wherein the carriage mechanism is further operative to convey the gripper assembly away from the first mold or second mold towards the retracted position while the gripper assembly is clamping the used release film, whereby to remove the used release film from the molding system.

2. The apparatus as claimed in claim 1, wherein the gripper assembly comprises at least one gripper finger extending from an elongated body of the gripper assembly for clamping onto the part of the used release film.

3. The apparatus as claimed in claim 2, wherein the at least one gripper finger comprises a cantilever body having a linked end attached to the elongated body.

4. The apparatus as claimed in claim 3, wherein the gripper assembly comprises first and second gripper fingers, and the cantilever body is configured to move the first gripper finger towards the second gripper finger.

5. The apparatus as claimed in claim 4, wherein the first and second gripper fingers are arranged parallel to each other and are kept parallel to each other when the first gripper finger is moved towards the second gripper finger.

6. The apparatus as claimed in claim 4, wherein the second gripper finger is fixed while the first gripper finger is movable.

7. The apparatus as claimed in claim 2, wherein each of the at least one gripper finger further comprises a resilient tip located at a free end of each of the at least one gripper finger to contact the used release film.

8. The apparatus as claimed in claim 7, wherein the resilient tip is configured to point towards the first mold or the second mold.

9. The apparatus as claimed in claim 8, wherein the resilient tip is interchangeably configurable to point towards the first mold or the second mold.

10. The apparatus as claimed in claim 2, wherein the actuator is configured to actuate the at least one gripper finger to move.

11. The apparatus as claimed in claim 10, wherein the actuator comprises a pneumatic actuator which includes an air outlet operative to expel air in order for the at least one gripper finger to clamp onto the part of the used release film.

12. The apparatus as claimed in claim 10, further comprising a sensor located on the gripper finger that is configured to detect whether the gripper finger has successfully clamped onto the used release film.

13. The apparatus as claimed in claim 12, wherein the sensor is further configured to detect whether the gripper finger is in contact with the used release film before the actuator actuates the gripper finger to move to clamp the used release film.

* * * * *